United States Patent [19]
Selwyn

[11] Patent Number: 5,961,772
[45] Date of Patent: Oct. 5, 1999

[54] ATMOSPHERIC-PRESSURE PLASMA JET

[75] Inventor: Gary S. Selwyn, Los Alamos, N.Mex.

[73] Assignee: The Regents of the University of California, Los Alamos, N.Mex.

[21] Appl. No.: 08/787,621

[22] Filed: Jan. 23, 1997

[51] Int. Cl.[6] .............................. C23F 1/02; C23C 16/00
[52] U.S. Cl. .............. 156/345; 315/111.21; 118/723 ER; 118/723 IR
[58] Field of Search ..................... 156/345; 118/723 ER, 118/723 IR; 315/111.21

[56] References Cited

U.S. PATENT DOCUMENTS

| | | | |
|---|---|---|---|
| 5,070,274 | 12/1991 | Yoshikawa et al. | 315/111.21 |
| 5,198,724 | 3/1993 | Koinuma et al. | 315/111.21 |
| 5,367,871 | 11/1994 | Venkataramani et al. | 60/39.821 |
| 5,369,336 | 11/1994 | Koinuma et al. | 315/111.21 |
| 5,372,674 | 12/1994 | Steinberg . | |
| 5,403,453 | 4/1995 | Roth et al. . | |
| 5,414,324 | 5/1995 | Roth et al. . | |
| 5,456,972 | 10/1995 | Roth . | |
| 5,587,093 | 12/1996 | Aston | 219/121.48 |
| 5,698,164 | 12/1997 | Kishioka et al. | 422/121 |

OTHER PUBLICATIONS

T.C. Manley, "The Electric Characteristics of the Ozonator Discharge," Trans. Electrochem. Soc. 84, 83 (1943).
J. Heidenreich et al., "Atmospheric Pressure Plasma Pen Driven by a Surfatron," IBM Technical Disclosure Bulletin 31, 234 (Feb. 1989).
M.A. Liebermann and A.J. Lichtenberg, *Principles of Plasma Discharges and Materials Processing*, pp. 367–368 (Wiley, 1994).

*Primary Examiner*—William Powell
*Assistant Examiner*—George A. Goudreau
*Attorney, Agent, or Firm*—Samuel M. Freund

[57] ABSTRACT

Atmospheric-pressure plasma jet. A γ-mode, resonant-cavity plasma discharge that can be operated at atmospheric pressure and near room temperature using 13.56 MHz rf power is described. Unlike plasma torches, the discharge produces a gas-phase effluent no hotter than 250° C. at an applied power of about 300 W, and shows distinct non-thermal characteristics. In the simplest design, two concentric cylindrical electrodes are employed to generate a plasma in the annular region therebetween. A "jet" of long-lived metastable and reactive species that are capable of rapidly cleaning or etching metals and other materials is generated which extends up to 8 in. beyond the open end of the electrodes. Films and coatings may also be removed by these species. Arcing is prevented in the apparatus by using gas mixtures containing He, which limits ionization, by using high flow velocities, and by properly shaping the rf-powered electrode. Because of the atmospheric pressure operation, no ions survive for a sufficiently long distance beyond the active plasma discharge to bombard a workpiece, unlike low-pressure plasma sources and conventional plasma processing methods.

21 Claims, 6 Drawing Sheets

ATMOSPHERIC-PRESSURE PLASMA JET

The present invention relates generally to plasma generation and applications of plasmas to etching and cleaning surfaces and, more particularly, to a coaxial, non-thermal, resonant cavity, atmospheric pressure plasma jet which generates metastable and reactive species. The invention was made with government support under Contract No. W-7405-ENG-36 awarded by the U.S. Department of Energy to The Regents of the University of California. The government has certain rights in this invention.

FIELD OF INVENTION

BACKGROUND OF THE INVENTION

Surface cleaning is a fundamental requirement for many industrial processes. It is also important for decontamination of objects. Traditionally, surface cleaning has been accomplished using solvent-based methods, technologies which have been available for more than 100 years. Increasing concerns about ground water and air pollution, greenhouse gases, and related health and safety issues have severely restricted the use of common volatile organic solvents, and even many of the recently-adapted, less hazardous chemical substitutes.

Plasmas have been used extensively in a wide variety of industrial and high technology applications, from semiconductor fabrication to coatings of reflective films for window panels and compact disks. Plasmas ranging in pressure from high vacuum (<0.1 mTorr) to several Torr are most common, and have been used for film deposition, reactive ion etching, sputtering and other forms of surface modification. The primary advantage of plasma cleaning is that it is an "all-dry" process, generates minimal effluent, does not require hazardous pressures, and is applicable to a wide variety of vacuum-compatible materials, including silicon, metals, glass, and ceramics.

Plasma cleaning, typically involving $O_2$ plasmas, is often used as a means of in-situ surface cleaning and is especially effective against hydrocarbon and other organic surface contaminants. Studies of $O_2$ plasmas used for surface cleaning have shown that atomic oxygen and $O_2^+$ is especially reactive to organic contaminants. However, because of the short lifetime of these reactants and their line-of-sight reactivity on the surface, these highly activated reactants are not especially well-suited for surface cleaning of irregular surfaces, especially unpolished wall surfaces or other roughened surfaces. Cleaning of surfaces with nicks, scratches, or anodized surfaces requires long-lived reactive species that can diffuse into minute scratches and openings without loss of chemical activity.

Use of a plasma at or above ambient atmospheric pressure, by contrast, does not require the article to be evacuated, thereby significantly reducing processing cost, and removes the requirement that the article to be cleaned must be capable of surviving under reduced pressure. To date, the problem with atmospheric pressure discharges has been the rapid recombination of atomic oxygen and $O_2^+$ at this pressure. However, metastable oxygen ($^1\Delta_g\, O_2$), formed in a plasma has a lifetime ranging from 0.1 sec (at atmospheric pressure) to 45 min. (at zero pressure), and also has 1 eV of internal energy to promote its chemical reactivity. Metastable oxygen production in plasmas is increased at higher pressures due to the three-body reaction: $2O+O_2 \rightarrow O_2(^1\Delta_g)+O_2$. Atomic oxygen is locally produced in the plasma from dissociation of ground-state molecular oxygen. Metastable oxygen also produced directly by the reaction $O_2+e \rightarrow O_2(^1\Delta_g)$, where the electron temperature has been optimized around 1 eV. Use of metastables including metastable $O_2$ for cleaning surfaces is a new concept, and permits plasma processing of both vacuum compatible and incompatible materials at reduced cost and complexity.

Atmospheric pressure plasma torches and flames rely on high-power dc or rf discharges and thermal ionization, respectively, operate at high temperatures, and produce substantial ionization. These plasmas destroy most surfaces they are applied to since the plasmas operate at extremely high temperatures and produce significant concentrations of ions.

Electric-discharge "plasma cells" are dielectric barrier discharge cells often referred to as ozonizer cells, since they are widely used in the industrial generation of ozone. See, e.g., T. C. Manley, "The Electric Characteristics of the Ozonator Discharge," Trans. Electrochem. Soc. 84, 83 (1943). Multiple, self-terminating microdischarges occur throughout the discharge volume as a result of the application of an alternating high-voltage waveform to one of the two electrodes. The feed gas typically contains oxygen and/or water vapor; highly reactive O and OH radicals being produced therefrom in the microdischarges. Significant concentrations of ions are also generated by the microdischarges.

In "Atmospheric Pressure Plasma Pen Driven by a Surfatron," by J. Heidenreich et al., IBM Technical Disclosure Bulletin 31, 234 (February 1989), a submillimeter dimension atmospheric plasma jet operating on argon, nitrogen and/or oxygen is described. This device was found to etch polymer-coated substrates at approximately 25 $\mu$m/min. under conditions of 200 W microwave power with about 2l/min. flow of argon, and permits the selective removal of polymer debris without the requirement of a vacuum system to create the plasma. However, the apparatus, which relies on surface wave generation, requires microwave frequencies, thereby presenting a health safety problem. Moreover, the plasma is generated over a 1 cm diameter area, is quite hot, and contains a significant concentration of ions.

In U.S. Pat. No. 5,414,324 for "One Atmosphere, Uniform Glow Discharge Plasma," which issued to John R. Roth et al. on May 9, 1995, a one-atmosphere, steady-state glow discharge plasma within the volume between a pair of insulated, equally spaced planar metal electrodes energized with an rms potential of 1–5 kV at 1–100 kHz is described. Roth et al. states that glow discharge plasmas are produced by free electrons which are energized by imposed direct current or rf electric fields, and then collide with neutral molecules, and that these neutral molecule collisions transfer energy to the molecules and form a variety of active species which may include photons, metastables, atomic species, free radicals, molecular fragments, monomers electrons, and ions. Surrounding the plate assembly is an environmental isolation enclosure in which a low feed gas flow is maintained in order to equal the leakage rate of the enclosure. In fact, a no flow condition is taught for normal operation of the apparatus. Materials may be processed by passing them through the plasma between the electrodes, where they are exposed to all plasma constituents including ions. See, e.g., U.S. Pat. No. 5,403,453 for "Method And Apparatus For Glow Discharge Plasma Treatment Of Polymer Materials At Atmospheric Pressure," which issued to John R. Roth et al. on Apr. 4, 1995, and U.S. Pat. No. 5,456,972 for "Method And Apparatus For Glow Discharge Plasma Treatment Of Polymer Materials At Atmospheric Pressure," which issued to John R. Roth on Oct. 10, 1995.

Accordingly, it is an object of the present invention to generate a low-temperature, atmospheric pressure plasma having substantial output of metastable and radical reactive species over a significant area.

Another object of the present invention is to generate a low-temperature atmospheric pressure plasma having substantial output of nonionic reactive species over a significant area.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the objects and purposes of the present invention, as embodied and broadly described herein, the apparatus for generating a gaseous jet containing concentrations of reactive species from an atmospheric pressure plasma discharge hereof may include in combination: an electrically conducting chamber having a closed end and an open end; a central electrode located within the chamber defining thereby an annular region; means for flowing gases through the annular region; and means for supplying rf energy to either of the central electrode or the electrically conducting chamber such that a continuous plasma discharge occurs between the electrode and the chamber, the gaseous products of the plasma discharge, including reactive species, exiting through the open end of the chamber.

It is preferred that the electrically conducting chamber has a longitudinal axis, the central electrode has a longitudinal axis, and the central electrode is disposed such that the longitudinal axis thereof is collinear with the longitudinal axis of the chamber.

Preferably also, the electrically conducting chamber is grounded and rf energy is applied to the central electrode.

In another aspect of the present invention, in accordance with its objects and purposes, as embodied and broadly described herein, the method for generating a gaseous jet containing concentrations of reactive species hereof may include the step of: generating an arcless, atmospheric pressure plasma discharge in a gas flowing through an annular region between an electrically conducting chamber having a closed end and an open end and a central electrode located within the chamber, and disposed such that an annular region is defined therebetween, whereby gaseous products of the plasma discharge, including reactive species, exit through the open end of the chamber.

Benefits and advantages of the invention include avoidance of vacuum confinement, and chemical generation of low-temperature, long-lived reactants capable of penetrating small spaces. Additionally, unlike conventional low-pressure and atmospheric plasmas, the APPJ etches surfaces using purely chemical metastable and radical reactants, thereby promoting high selectivity and diffusion, properties that cannot co-exist with ion-induced reaction processes. Although ions are formed inside the plasma discharge, no ions have been observed to exit the present apparatus. This provides enhanced chemical etch selectivity.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 2a is a schematic representation of the front view of another embodiment of the rf-powered electrode showing longitudinally placed slots therein, while

DETAILED DESCRIPTION

Briefly, the present invention includes a γ-mode, resonant-cavity plasma discharge that can be operated at atmospheric pressure and near room temperature using 13.56 MHz rf power. Unlike plasma torches, the discharge produces a gas-phase effluent no hotter than 250° C. at an applied power of about 300 W, and shows distinct non-thermal characteristics. In the simplest design, two concentric cylindrical electrodes are employed to generate a plasma in the annular region therebetween. A "jet" of long-lived metastable and reactive species that are capable of rapidly cleaning or etching metals and other materials is generated which extends up to 8 in. beyond the open end of the electrodes. Films and coatings may also be removed by these species. Arcing is prevented in the apparatus by using gas mixtures containing He, which limits ionization, by using high flow velocities, and by properly shaping the rf-powered electrode. Because of the atmospheric pressure operation, no ions survive for a sufficiently long distance beyond the active plasma discharge to bombard a workpiece, unlike low-pressure plasma sources and conventional plasma processing methods. Additionally, the metastable and radical species must diffuse to the surface for an etching reaction to occur. This ensures that isotropic etching of the material occurs. The key to the successful operation of the plasma jet is 1. Generation of electrons at rates exceeding loss of electrons by collisional and wall processes; 2. Limiting arcing by maintenance of a high impedance plasma; and 3. Generation of reactive metastables that persist for sufficient time to travel from the jet to the target surface, even at atmospheric pressure.

Moreover, by using a $CF_4/O_2/He$ feed gas, the atmospheric-pressure plasma jet (APPJ) etches tantalum, tungsten, and silicon dioxide 2, 3, and 10 times faster, respectively, than can low-pressure plasmas. Polyimide films are etched nearly 30 times faster with an $O_2/He$ APPJ than with conventional low-pressure plasmas using the same feed gas. The APPJ can be used to selectively etch surfaces; that is, the reactive species generated using the $CF_4/O_2/He$ mixture have been found not to attack organic polymers, while those derived from the $O_2/He$ mixture do not etch metal or glass surfaces. Improved selectivity results from chemical etch processes which occur without ion bombardment; that is, although ions are formed inside the plasma discharge, no ions have been observed to exit the present apparatus.

Figure 1:
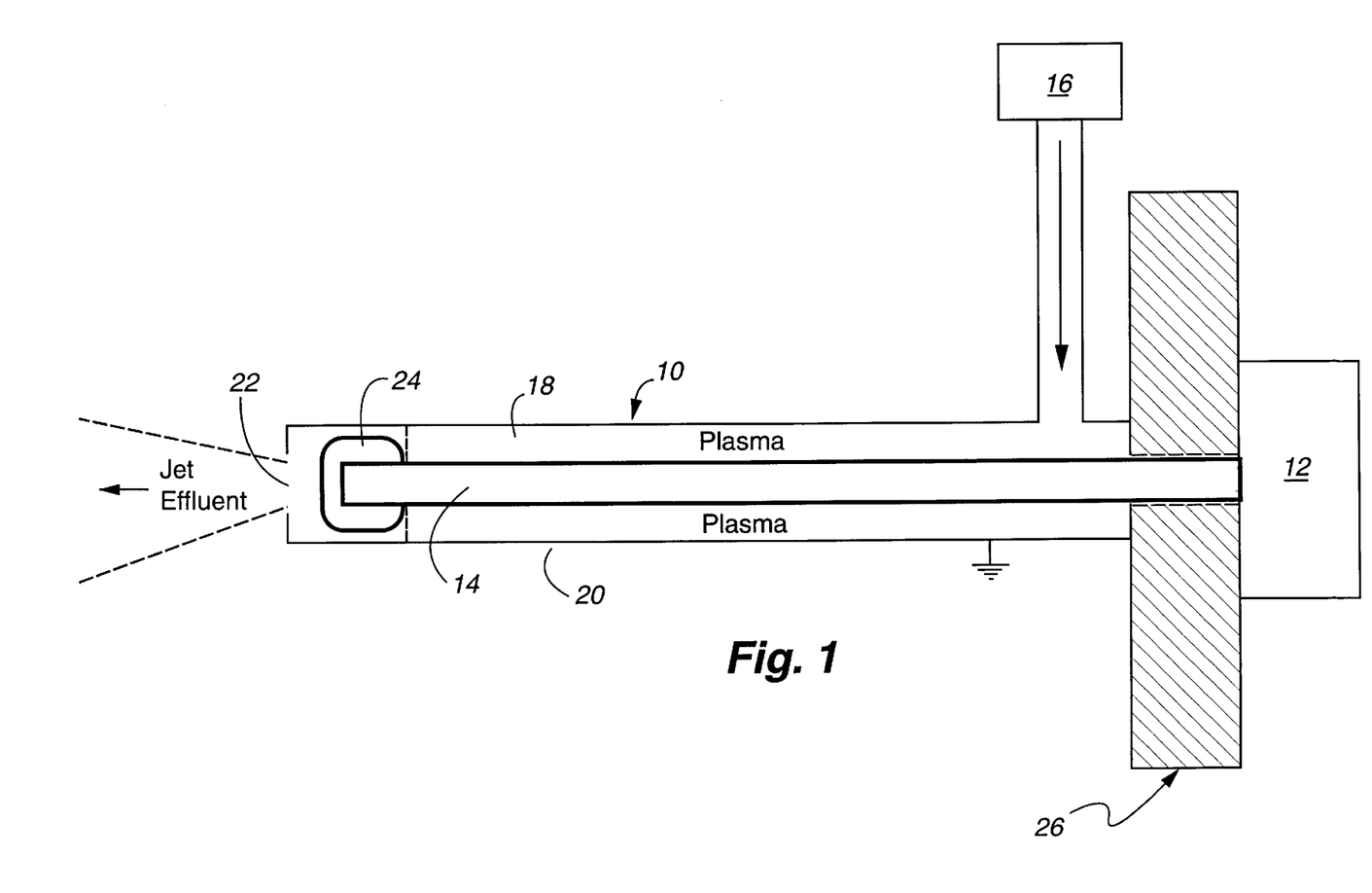
FIG. 1 is a schematic representation of a side planar view of the apparatus of the present invention showing a cylindrical rf-powered electrode axially positioned within an open, grounded cylinder.

Reference will now be made in detail to the present preferred embodiments of the invention, examples of which are illustrated in the accompanying drawings. Identical callouts are used to depict similar or identical structure. FIG. 1 is a schematic representation of a side planar view of the apparatus of the present invention, 10. Capacitively-coupled, rf source, 12, which operates at the commercial band frequency of 13.56 MHz, supplies rf power to central or powered, rod-shaped electrode, 14 (OD=0.3125", length= 4.60" active length), and metered gas source, 16, provides a high flow of chosen gases through the annular region, 18, between central electrode 14 and hollow, cylindrical grounded electrode or electrically conducting chamber, 20 (OD=0.875", ID=0.625", length=4.80"). Use of this conventional excitation frequency, which is also the working frequency of plasma processing equipment for the semiconductor industry, is highly desirable, as power supplies, cables, and connectors are inexpensive and widely available. Moreover, unregulated operation at this frequency is permitted by the Federal Communications Commission. The gas exits through open end, 22 (0.250" dia.), in the apparatus. Metastable and other reactive species have been observed in a plume extending up to 8" from the end of the grounded chamber. Alumina cap, 24, (OD=0.5", ID=0.313", length=0.5") reduces arcing between the electrodes. The entire assembly is supported by flange, 26. Operation at atmospheric pressure is stable, repeatable, and is easily ignited. Atmospheric operation also produces much higher conversion of gas-phase reactive metastable species than would be expected by linearly extrapolation from low-pressure discharge operation. Unlike plasma torches, the APPJ produces a gas-phase effluent no hotter than about 250° C. at an rf power of 300 W, and shows distinct non-thermal characteristics as measured by spectroscopic analysis inside the source. Water cooling of the apparatus was found to be unnecessary unless the rf power exceeded 300 W. Arcing is prevented in the APPJ by using He gas mixtures, which limit ionization, by using high flow velocities, and by properly shaping the rf-power electrode. There is evidence that indicates that electron density required for plasma sustenance is increased by minimizing electron losses by electron trapping by means of the hollow cathode effect; that is, by sheath repulsion at all surfaces along the cavity, except in the axial flow direction, and by operation in a γ-mode (See, e.g., *Principles of Plasma Discharges and Materials Processing,* by M. A. Liebermann and A. J. Lichtenberg, Wiley, pp 367–368 (1994).) in which the electron losses are compensated for by the combination of secondary electron emission and photoelectric emission from the ground and powered metal surfaces. Geometry, spacing and materials used in the APPJ are essential for stable operation at a selected rf frequency. Similarly, differences are observed in the use of different metals exposed to the plasma. Avoidance of negative ion generation, which proportionally reduces electron densities is also important for sustaining a stable, uniform glow discharge, as is the use of high gas flow rates, which reduces the conductivity of the plasma.

Figure 2A:
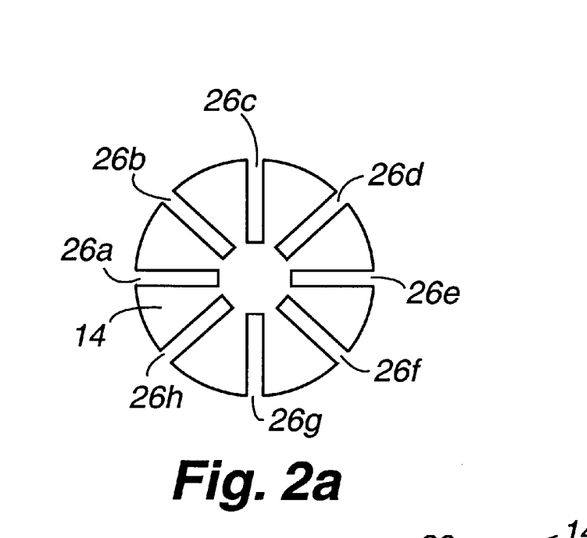
Figure 2B:
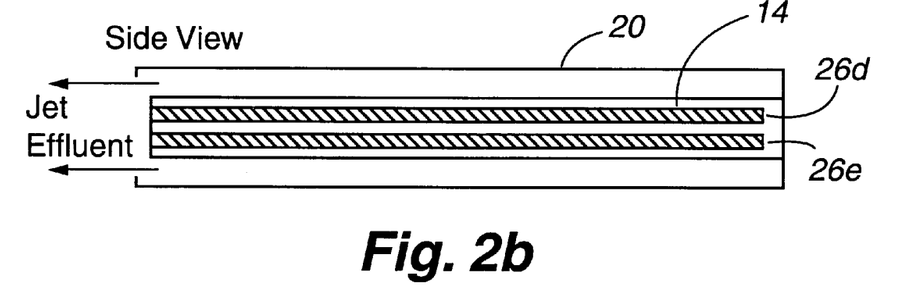
FIG. 2b is a schematic representation of a side view thereof.

FIG. 2a is a schematic representation of the front view of another embodiment of rf powered electrode 14, showing longitudinally placed slots or flutes, 26a–h, therein, while FIG. 2b is a schematic representation of a side view thereof.

Each flute is shown in the FIG. 2 to have the same width and the same depth, typically 0.02–0.1" wide, and it is preferred that the ratio of the width to the depth of the flutes is approximately one-third. The use of such slots has been found to produce an enhanced plasma density that provides a broader operating window without arcing than the same conditions using a solid, coaxial rf-powered electrode. That is, the apparatus can operate over a wider $He/O_2$ mixture range and at higher rf powers without arcing. It is believed by the inventor that the enhancement in plasma density is due to greater secondary electron emission resulting from the enlarged surface area of the electrode and by confinement of electrons between the slots. Reduced arcing occurrence results because the opposing sides of the slots on the electrode have the same potential, so the electric field is reduced. With a flow of 8 slm (standard liters per minute) of He and 0.5 slm of $O_2$, operation at 300 W of rf power has been demonstrated without arcing. The same flow using a solid electrode will produce significant arcing at this rf power level. He flow reduces arcing due to its very high ionization potential, but use of He is undesirable in many circumstances due to added gas cost and the limited capability of recycling helium under these fabrication or processing conditions. In general, arc-free operation has been found to occur down to approximately one-fourth the helium flow rate for similar operation with the solid electrode. It should be mentioned that a ceramic end cap similar to that employed in FIG. 1 hereof (24) is utilized in order to reduce the possibility of arcing to the grounded cylindrical chamber from the high electric field present at the end of the powered electrode.

Figure 3:
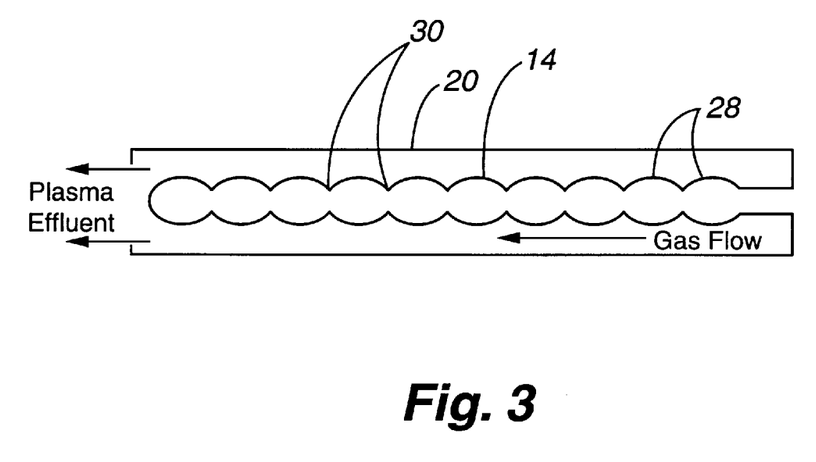
FIG. 3 is a schematic representation of the side view of a contoured rf-powered electrode embodiment of the present invention.

FIG. 3 is a schematic representation of the side view of a third embodiment of the apparatus of the present invention. Contours or ribs are formed in the rf-power electrode in order to reduce He use, and for operating using pure air or air/water mixtures without arcing. It is known that arcing is caused by low plasma impedance which results in a steadily increasing current flow, thereby further reducing the plasma impedance since, as the plasma impedance continues to diminish, ionization is enhanced, thereby generating an arc. To inhibit arcing, a high plasma impedance must be maintained. One manner to accomplish this is to limit the rate of ionization in the plasma. The contoured electrode 14 operates by maintaining a high electric field between the high points of the contours, 28, which are closest to the hollow, cylindrical grounded chamber 20. At the low points, 30, of the contoured electrode, the electric field is lower and is insufficient to initiate a discharge. By using a high gas flow rate, ions generated in the space nearest to the high points are rapidly swept out of this region and into the volume over the low points of the electrode. Equivalently, gas-phase species near the low points of the contoured electrode are carried into the volume over the high points, where the plasma is sustained. Limited ionization and a high plasma impedance are maintained by the constant, fast flow of ions formed over the high points of the electrode to the space over the low points of the electrodes. There a low electric field reduces the rate of ionization and allows recombination of ions and electrons to reduce the plasma density. As the gas then flows into the high points of the electrode, increased ionization occurs, but only for sufficient time to compensate for the earlier loss of plasma density.

Functionally, this is equivalent to using a supersonic flow rate with a solid, concentric electrode in that ionization is limited by the ion residence time in the plasma. However, use of the contours on the electrode surface permits this to occur at a more reasonable flow rate. Moreover, turbulence and problems with APPJ recoil and pressure buildup are also avoided. As built, the rf powered electrode was between 10 and 100 cm long to provide sufficient residence time of the flowing gas to result in efficient conversion of ground-state species to excited vibrational/electronic states or metastable species. The high points were 1/16 in. from inner surface of the hollow, cylindrical grounded chamber, while the low points were 1/4 in. therefrom. This small change in spacing was found to maintain the plasma discharge and extinguish the discharge, respectively.

Figure 4:
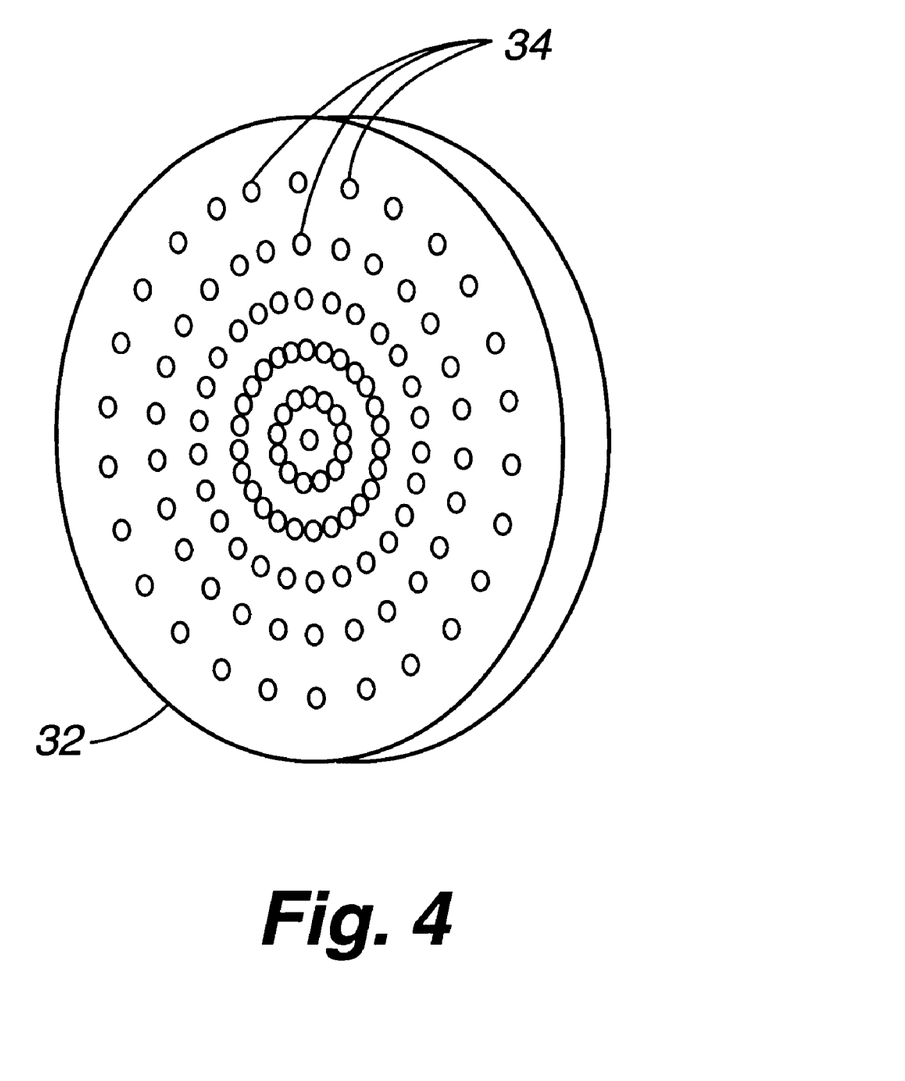
FIG. 4 is a schematic representation of a perspective view of a "shower head" end cap which may be attached to the open end of the hollow, electrically conducting cylindrical chamber.

FIG. 4 is a schematic representation of a perspective view of a "shower head" end cap, 32, which may be attached to the open end of the hollow, electrically conducting cylindrical chamber. It was found that use of an end cap having a plurality of 1/8–1/16 in. diameter holes, 34, produced a uniform distribution of reactive species. By contrast, although all embodiments of the apparatus of the present invention could be operated without such a cap, reactive species were found to have a significant variation in concentration.

Figure 5:
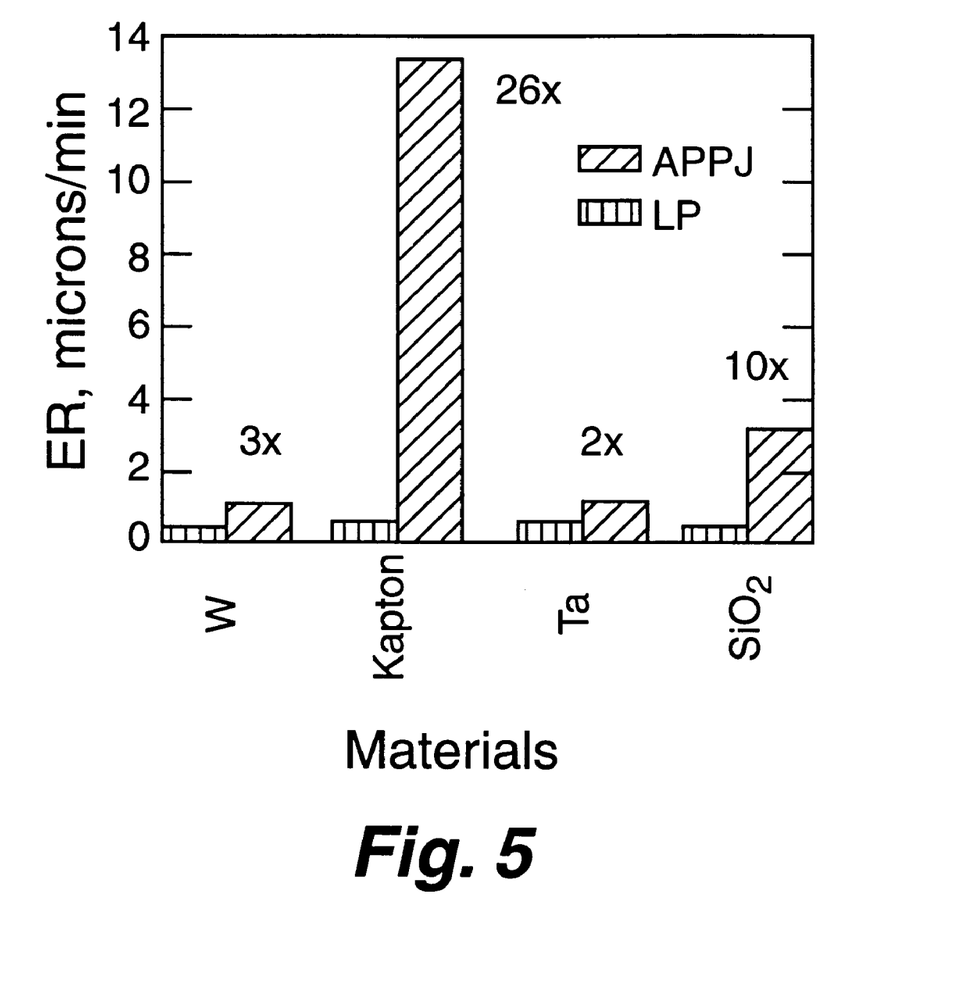
FIG. 5 is a graph of the etch rates for the apparatus of the present invention (APPJ) for certain materials as compared with etch rates for low-pressure plasmas (LP).

FIG. 5 is a graph of the etch rates for the apparatus of the present invention (APPJ) for identified materials as compared with etch rates for low-pressure plasmas (LP) of the same materials. For the tungsten, tantalum and silicon dioxide etching, the plasma gas composition was helium (20–30 slm), carbon tetrafluoride (1 slm), and argon (1 slm), while for kapton, the plasma gas was helium (30 slm) and oxygen (0.5 slm). As stated above, these reactions are highly selective; the reactive species generated with the $CF_4/O_2/He$ mixture does not attack polyimide films, while the $O_2/He$ mixture does not etch metal or glass surfaces.

Figure 6:
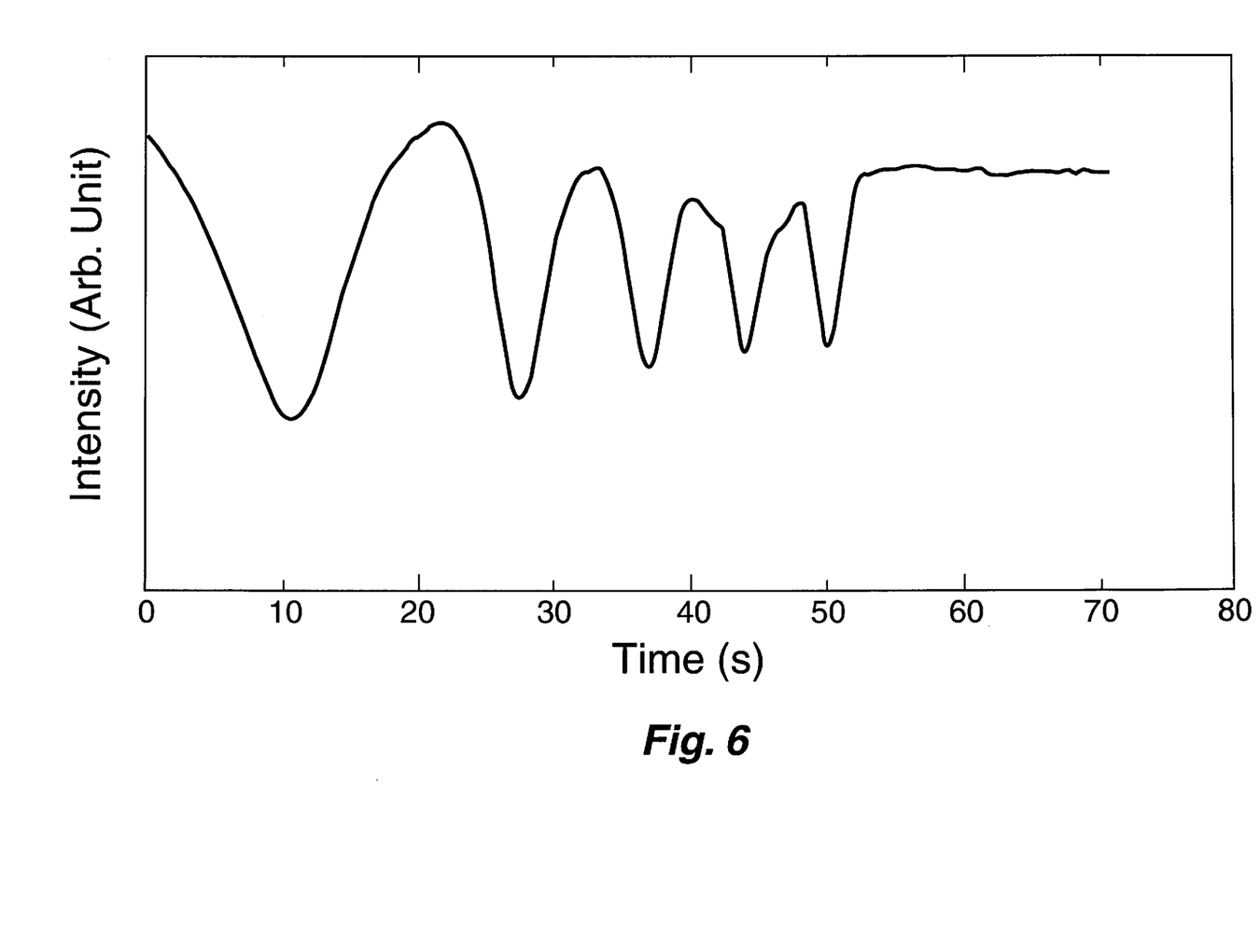
FIG. 6 is a graph of the laser interferometric pattern versus time for the etching to complete removal of an organic polymer positive photoresist on a silicon substrate.

FIG. 6 is a graph of the laser interferometric pattern versus time for the etching to complete removal of an organic polymer positive photoresist on a silicon substrate. It was also observed that flat black paint which was sprayed onto masonry and permitted to dry could be completely removed by the action of an atmospheric plasma, according to the teachings of the present invention, using a $He/O_2/H_2O$ flowing gas mixture (30 slm of He and 0.5 slm of $O_2$ bubbled through a fritted disk into a liquid sample of water), which was shown to generate OH radicals as a reactive effluent.

The foregoing description of the invention has been presented for purposes of illustration and description and is not intended to be exhaustive or to limit the invention to the precise form disclosed, and obviously many modifications and variations are possible in light of the above teaching. For example, it is unnecessary that the electrically conducting chamber be grounded, or that the chamber and central electrode be cylindrical in shape. In fact, the rf energy may be applied to the electrically conducting chamber and the central electrode grounded. Any smooth annular region can be used to sustain an arcless, atmospheric pressure discharge according to the teachings of the present invention. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for generating an atmospheric pressure plasma discharge which comprises in combination:

a. an electrically conducting, grounded cylindrical chamber which is not tapered having a closed end, an open end, and a longitudinal axis;

b. a cylindrical electrode located within said cylindrical chamber having a longitudinal axis and disposed such that the longitudinal axis thereof is collinear with the longitudinal axis of said cylindrical chamber, defining thereby an annular region;

c. means for flowing gases through the annular region; and d. means for supplying rf energy to said cylindrical electrode such that a continuous plasma discharge occurs between said cylindrical electrode and said grounded chamber with no visible arcs being formed, the gaseous products of the plasma discharge exiting through the open end of said cylindrical chamber.

2. The apparatus for generating an atmospheric pressure plasma discharge as described in claim 1, further comprising a cylindrical insulating cap located at the end of said cylindrical electrode at the end thereof closest to the open end of said cylindrical chamber, and inside said cylindrical chamber, for preventing arcing between said cylindrical electrode and said cylindrical chamber.

3. The apparatus for generating an atmospheric pressure plasma discharge as described in claim 2, wherein said insulating cap is an alumina cap.

4. The apparatus for generating an atmospheric pressure plasma discharge as described in claim 1, wherein said cylindrical electrode has longitudinal slots therein, each slot having a chosen width and a chosen depth.

5. The apparatus for generating an atmospheric pressure plasma discharge as described in claim 4, wherein each slot has the same width and the same depth and wherein the ratio of the chosen width to the chosen depth of the slots is approximately one-third.

6. The apparatus for generating an atmospheric pressure plasma discharge as described in claim 1, wherein said cylindrical electrode includes a plurality of smooth contours, each contour having a peak and a valley, whereby the plasma discharge is maintained between said hollow, grounded cylindrical chamber and said cylindrical electrode in the region of the peak of a contour and extinguished in the valley thereof.

7. The apparatus for generating an atmospheric pressure plasma discharge as described in claim 1, wherein a cap having a plurality of holes therethrough is fitted on the open end of said hollow, grounded cylindrical chamber such that a uniform distribution of the gaseous products of the plasma discharge exiting through the open end of said cylindrical chamber is obtained.

8. The apparatus for generating an atmospheric pressure plasma discharge as described in claim 1, wherein the flowing gas includes a $CF_4/O_2/He$ mixture.

9. The apparatus for generating an atmospheric pressure plasma discharge as described in claim 1, wherein the flowing gas includes a $O_2/He$ mixture.

10. The apparatus for generating an atmospheric pressure plasma discharge as described in claim 1, wherein the flowing gas includes a $O_2/H_2O/He$ mixture.

11. An apparatus for generating a gaseous jet containing concentrations of reactive species from an atmospheric pressure plasma discharge which comprises in combination:

a. an electrically conducting chamber which is not tapered having a closed end and an open end;

b. a central electrode located within said chamber defining thereby an annular region;

c. means for flowing gases through the annular region; and d. means for supplying rf energy to either of said central electrode or said electrically conducting chamber with no visible arcs being formed such that a continuous plasma discharge occurs between said electrode and said chamber, the gaseous products of the plasma discharge, including reactive species, exiting through the open end of said chamber.

12. The apparatus for generating a gaseous jet containing concentrations of reactive species from an atmospheric pressure plasma discharge as described in claim 11, wherein said electrically conducting chamber has a longitudinal axis and said central electrode has a longitudinal axis, and whereby said central electrode is disposed such that the longitudinal axis thereof is collinear with the longitudinal axis of said chamber.

13. The apparatus for generating a gaseous jet containing concentrations of reactive species from an atmospheric pressure plasma discharge as described in claim 11, further comprising an insulating cap located at the end of said electrode at the end thereof closest to the open end of said chamber, and inside said chamber, for preventing arcing between said electrode and said chamber.

14. The apparatus for generating a gaseous jet containing concentrations of reactive species from an atmospheric pressure plasma discharge as described in claim 13, wherein said insulating cap is an alumina cap.

15. The apparatus for generating a gaseous jet containing concentrations of reactive species from an atmospheric pressure plasma discharge as described in claim 12, wherein said electrode has longitudinal slots therein, each slot having a chosen width and a chosen depth.

16. The apparatus for generating a gaseous jet containing concentrations of reactive species from an atmospheric pressure plasma discharge as described in claim 15, wherein each slot has the same width and the same depth and wherein the ratio of the chosen width to the chosen depth of the slots is approximately one-third.

17. The apparatus for generating a gaseous jet containing concentrations of reactive species from an atmospheric pressure plasma discharge as described in claim 11, wherein said electrode includes a plurality of smooth contours, each contour having a peak and a valley, whereby the plasma discharge is maintained between said chamber and said electrode in the region of the peak of a contour and extinguished in the valley thereof.

18. The apparatus for generating a gaseous jet containing concentrations of reactive species from an atmospheric pressure plasma discharge as described in claim 11, wherein a cap having a plurality of holes therethrough is fitted on the open end of said chamber such that a uniform distribution of the gaseous products of the plasma discharge exiting through the open end of said chamber is obtained.

19. The apparatus for generating a gaseous jet containing concentrations of reactive species from an atmospheric pressure plasma discharge as described in claim 11, wherein the flowing gas includes a $CF_4/O_2/He$ mixture.

20. The apparatus for generating a gaseous jet containing concentrations of reactive species from an atmospheric pressure plasma discharge as described in claim 11, wherein the flowing gas includes a $O_2/He$ mixture.

21. The apparatus for generating a gaseous jet containing concentrations of reactive species from an atmospheric pressure plasma discharge as described in claim 11, wherein the flowing gas includes a $O_2/H_2O/He$ mixture.

\* \* \* \* \*